United States Patent
Mahanpour et al.

(10) Patent No.: US 6,309,899 B1
(45) Date of Patent: Oct. 30, 2001

(54) METHOD AND SYSTEM FOR REMOVING A DIE FROM A SEMICONDUCTOR PACKAGE

(75) Inventors: Mehrdad Mahanpour, Union City; Jose Hulog, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/510,577

(22) Filed: Feb. 22, 2000

(51) Int. Cl.[7] .............................. H01L 21/66; G01R 31/26
(52) U.S. Cl. ................................. 438/15; 438/4; 438/14
(58) Field of Search ................................ 438/4, 14, 15, 438/124, 126, 977; 264/272.17

(56) References Cited

U.S. PATENT DOCUMENTS

| | | | |
|---|---|---|---|
| 5,240,546 | * 8/1993 | Shiga | 156/378 |
| 5,344,795 | * 9/1994 | Hashemi et al. | 264/272.15 |
| 5,946,556 | * 8/1999 | Hashizume | 438/126 |
| 5,976,897 | * 11/1999 | Gomez | 438/4 |
| 6,030,282 | * 2/2000 | Mahanpour | 451/364 |
| 6,127,194 | * 10/2000 | Mahanpour et al. | 438/14 |

* cited by examiner

Primary Examiner—Charles Bowers
Assistant Examiner—Asok Kumar Sarkar
(74) Attorney, Agent, or Firm—Sawyer Law Group LLP

(57) ABSTRACT

A method and system for removing a die from a semiconductor package is disclosed. The semiconductor package includes the die and a ceramic base. The die has a first face, a second face and a plurality of sides. The second face of the die is coupled with the ceramic base. The method and system include covering at least the first face and a portion of the plurality of sides of the die with a hard wax and encapsulating the hard wax and at least a first portion of the ceramic base in a resin. The method and system also include removing at least a second portion of the ceramic base to expose the second face of the die and removing the hard wax to free the die.

11 Claims, 9 Drawing Sheets

METHOD AND SYSTEM FOR REMOVING A DIE FROM A SEMICONDUCTOR PACKAGE

FIELD OF THE INVENTION

The present invention relates to semiconductor devices, and more particularly to a method and system for more easily removing a die from a semiconductor device including a ceramic base.

BACKGROUND OF THE INVENTION

FIG. 1 depicts a current semiconductor package 10. The semiconductor package 10 is a flip-chip package. The semiconductor package 10 includes a semiconductor die 12 on a ceramic base 14. The semiconductor package 10 is termed a flip-chip package because the top face of the die 10 is facing the ceramic base 14. Thus, contact is made to circuits within the die 12 through solder bumps 16. An underfill 18 is also included in the semiconductor package 10 and aids in bonding the die 12 to the ceramic base 14. The ceramic base 14 typically has a layer of metal 15 close to the top surface of the ceramic base 14. The ceramic base 14 is coupled to pins 19 which allow the die 12 to be electrically coupled to an outside circuit (not shown).

Although the semiconductor package 10 function when formed properly, current processing methods for semiconductor packages 10 typically does not result in all dies 12 functioning as desired. It is relatively simple to determine the failure mode, such as whether there is a short in a circuit within the die 12 or whether a particular voltage is being output. However, in order to determine the failure mechanism, the location and nature of the fault, the die 12 must be removed from the semiconductor package 10. In particular, the die 12 must be separated from the ceramic base 14. The die 12 can then be deprocessed and the failure mechanism determined.

FIGS. 2A and 2B depict a conventional system 20 and method 30 for removing the die 12 from the semiconductor package 10. Referring to FIGS. 2A and 2B, the die 12 is thinned, typically to between fifty and eighty microns, and a second die 22 is glued to the thinned die 12, via step 32. The second die 22 is typically a piece of silicon without any circuitry and of approximately the same size as the die 12. Generally, the ceramic base 14 is also trimmed to a certain extent. The combination of the thinned die 12, the second die 22 and the ceramic base 14 is then encapsulated in resin 24, via step 34. FIG. 2A depicts the thinned die 12, the ceramic base 14 and the second die 22 after being encapsulated in the resin 24. Typically, the encapsulation step 34 is carried out so that the ceramic base 14 is exposed. For example, the thinned die 12, the ceramic base 14 and the second die 22 may be placed in a mold with the ceramic base 14 down. The mold is then filled with resin and, after the resin has cured, removed from the mold. The ceramic base 14 is then ground until the die 12 has been exposed, via step 36. Typically, the grinding step is accomplished by mechanically grinding the ceramic base, and any resin 24 surrounding the ceramic base 14.

Although the method 30 functions, one of ordinary skill in the art will readily recognize that the die 12 typically cannot be removed from the resin 24. Currently, no known solvent will etch the resin 24 without damaging the die 12. Consequently, although the die 12 can be separated from the ceramic base 14, the die 12 cannot be easily deprocessed. Consequently, it is difficult, if not impossible, to determine a failure mechanism for the die 12 when the method 30 is used.

FIGS. 3A and 3B depict another conventional system 40 and method 50 for removing a die 12 from the semiconductor package 10. The die 12 is thinned and, if desired, glued to a second die (not shown), via step 52. The die 12 and ceramic base 14 are then fixed in a sample holder using a soft wax, via step 54. FIG. 3A depicts a sample holder 42 and the soft wax 44 which holds the die 12 and ceramic 14 in place. The soft wax 44 is typically somewhat pliable at room temperature. Note that the sample holder 42 need not have a recess which contains the soft wax 44, die 12 and ceramic base 14. Instead, the sample holder 42 may simply have a planar surface. The soft wax then simply affixes the die 12 and ceramic base 14 to the planar surface of the sample holder 42. The ceramic base 14 is then ground away to expose the die 12, via step 56. Typically, the ceramic base 14 is mechanically ground. The die 12 is then removed from the soft wax 44, by heating up the sample holder 42 and melting the soft wax 44.

Although the method 50 may separate the die 12 from the ceramic base 14, one of ordinary skill in the art will readily recognize that the method 50 is subject to failure. In particular, the die 12 often breaks during grinding of the ceramic base 14. For example, when the ceramic base 14 becomes very thin, the layer of metal 15 within the ceramic base 14 often fractures, breaking the remainder of the ceramic base 14 and the die 12. Furthermore, grinding heats the die 12 and ceramic base 14. As a result, the soft wax 44 softens further. This allows the die 12 and ceramic base 14 to move within the sample holder 42 during grinding. Consequently, the ceramic base 14 and die 12 are subject to breakage. Once the die 12 breaks, it becomes difficult if not impossible to deprocess the die 12. Consequently, failure mechanisms within the die 12 cannot be determined.

Accordingly, what is needed is a system and method for removing a semiconductor die from a semiconductor package. The present invention addresses such a need.

SUMMARY OF THE INVENTION

A method and system for removing a die from a semiconductor package is disclosed. The semiconductor package includes the die and a ceramic base. The die has a first face, a second face and a plurality of sides. The second face of the die is coupled with the ceramic base. The method and system comprise covering at least the first face and a portion of the plurality of sides of the die with a hard wax and encapsulating the hard wax and at least a first portion of the ceramic base in a resin. The method and system also comprise removing at least a second portion of the ceramic base to expose the second face of the die and removing the hard wax to free the die.

According to the system and method disclosed herein, the present invention provides a simple method for removing a die from a semiconductor package. Moreover, the method is the only known procedure for removing a thin die from a package.

DETAILED DESCRIPTION OF THE INVENTION

The present invention relates to an improvement in investigating semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Figure 1:
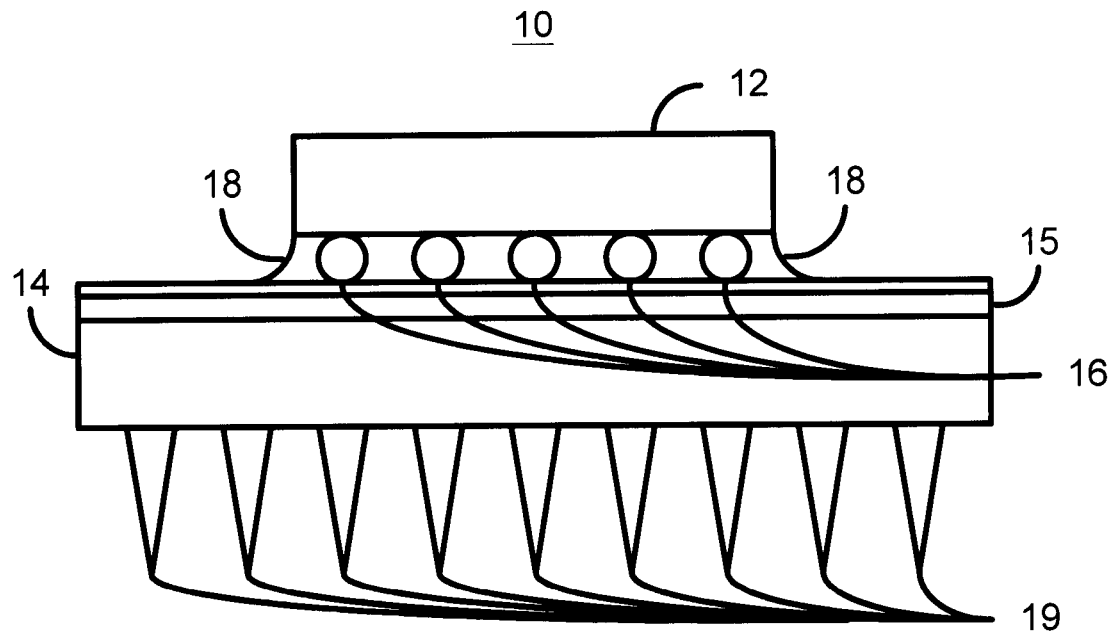
FIG. 1 is a diagram of a semiconductor package.
Figure 2A:
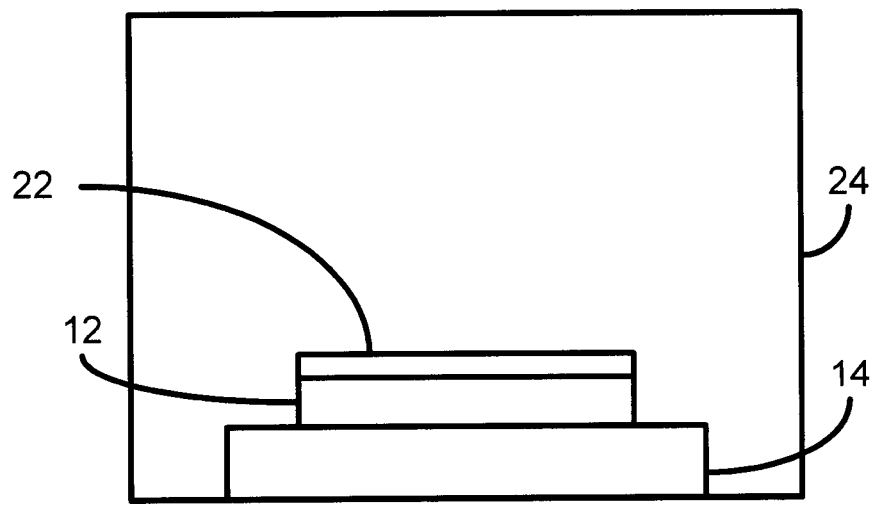
FIG. 2A is a diagram of one conventional system for removing a die from the semiconductor package.
Figure 2B:
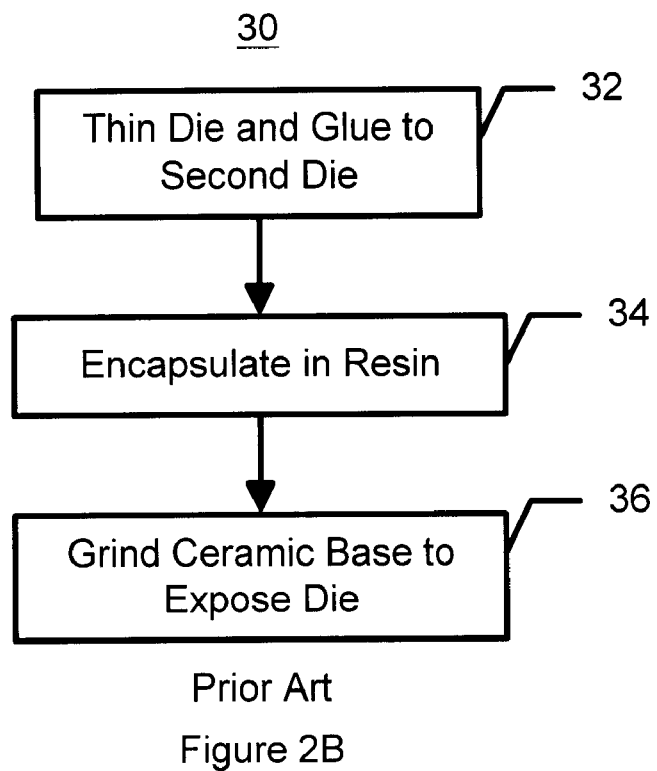
FIG. 2B is a diagram of one conventional method for removing a semiconductor die from the semiconductor package.
Figure 3A:
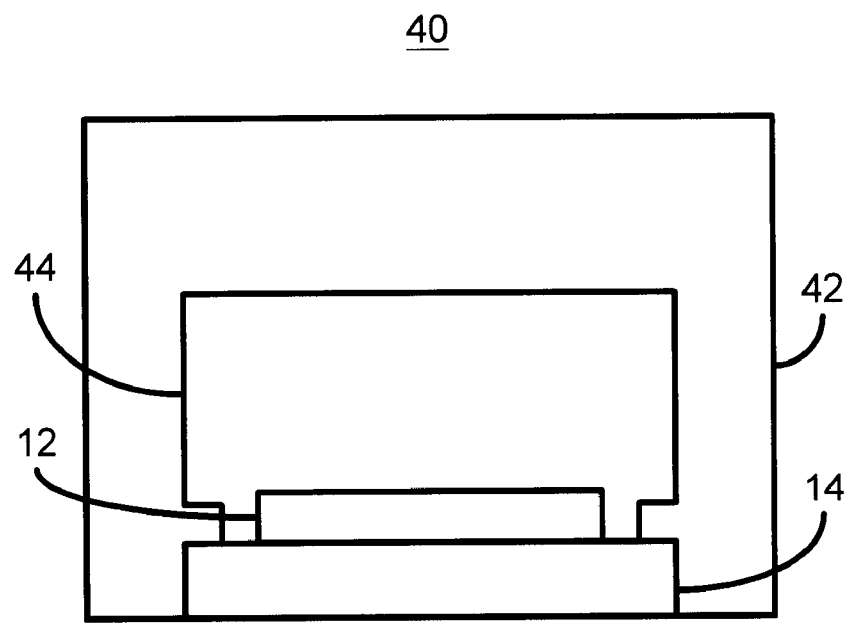
FIG. 3A is a diagram of another conventional system for removing a semiconductor die from the semiconductor package.
Figure 3B:
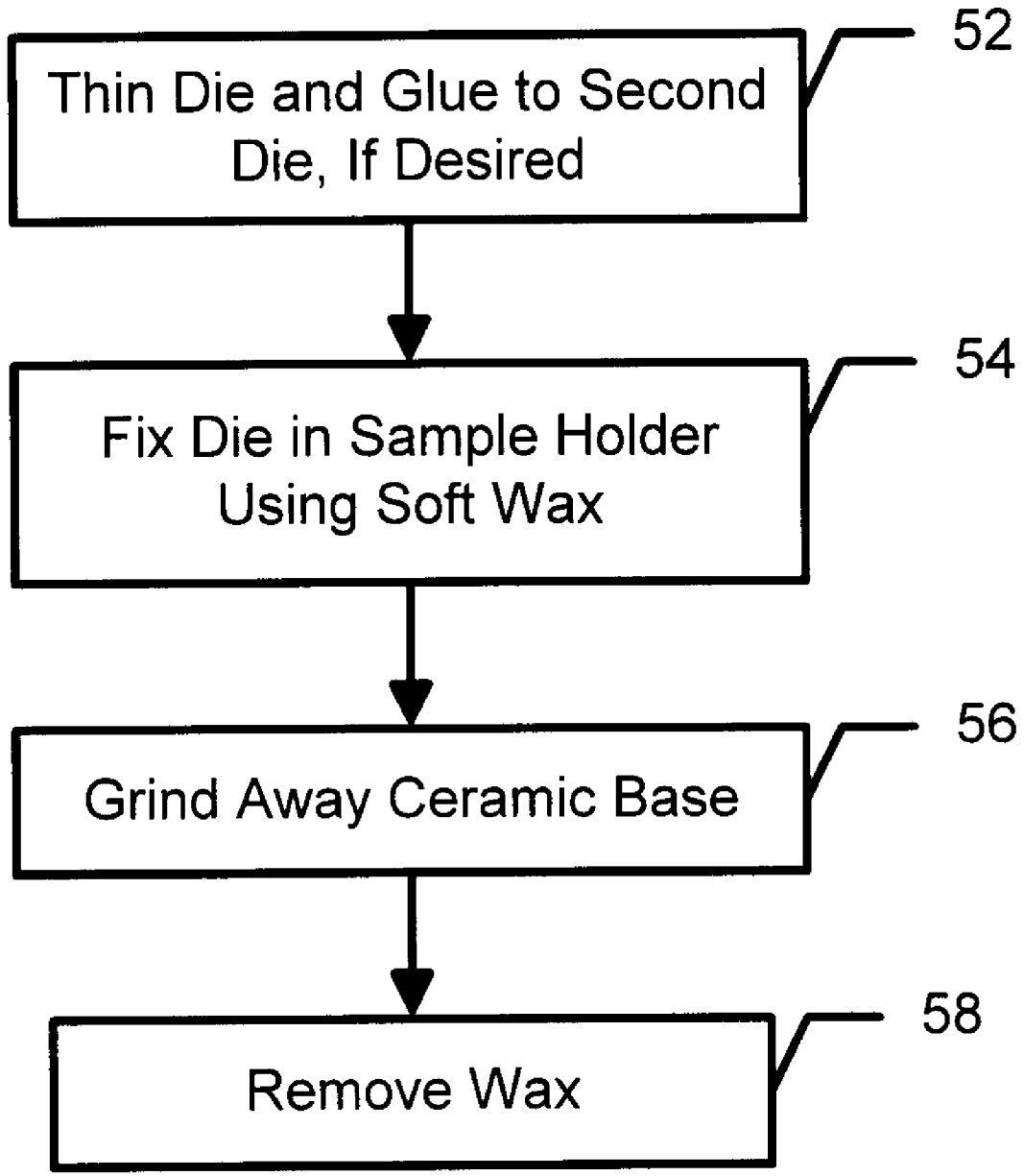
FIG. 3B is a diagram of another conventional method for removing a semiconductor die from the semiconductor package.

Currently, semiconductor packages, such as the semiconductor package 10 depicted in FIG. 1, are used. The semiconductor package 10 is a flip-chip package, in which the top face of the die 12 is facing the underlying ceramic base 14. Although the semiconductor package 10 can be commercially fabricated in large quantities, often fabrication results in faults. To improve processing, the failure mode and failure mechanisms for the die 12 are desired to be determined. The failure mode, the electrical nature of the fault, can be relatively easily determined. However, the failure mechanism, the location and nature of the fault, is more difficult to determine. In order to determine the failure mechanism, the die 12 must be removed from the semiconductor package 10 and separated from the ceramic base 14. Furthermore, the die 12 must be readily deprocessed.

Conventional methods and systems exist for separating the die 12 from the ceramic base 14. However, the conventional methods and systems typically suffer from at least one of two problems. Some conventional methods and systems fix the die 12 in resin or another material from which the die 12 cannot be removed. As a result, the die 12 cannot be easily deprocessed. Other conventional methods often result in the die 12 being broken during separation from the ceramic base 14. The broken die 12 cannot be deprocessed. Thus, using conventional methods, the failure mechanisms for the die 12 are difficult if not impossible to determine.

A method and system for removing a die from a semiconductor package is disclosed. The semiconductor package includes the die and a ceramic base. The die has a first face, a second face and a plurality of sides. The second face of the die is coupled with the ceramic base. The method and system comprise covering at least the first face and a portion of the plurality of sides of the die with a hard wax and encapsulating the hard wax and at least a first portion of the ceramic base in a resin. The method and system also comprise removing at least a second portion of the ceramic base to expose the second face of the die and removing the hard wax to free the die.

The present invention will be described in terms of particular package, a particular method, and particular materials such as ceramics, solvents and hard waxes. However, one of ordinary skill in the art will readily recognize that this method and system will operate effectively for other packages, other methods and other materials. Furthermore, the present invention will be described in the context of a flip-chip package. However, nothing prevents the method and system from being used for removing the die from other semiconductor packages.

Figure 4:
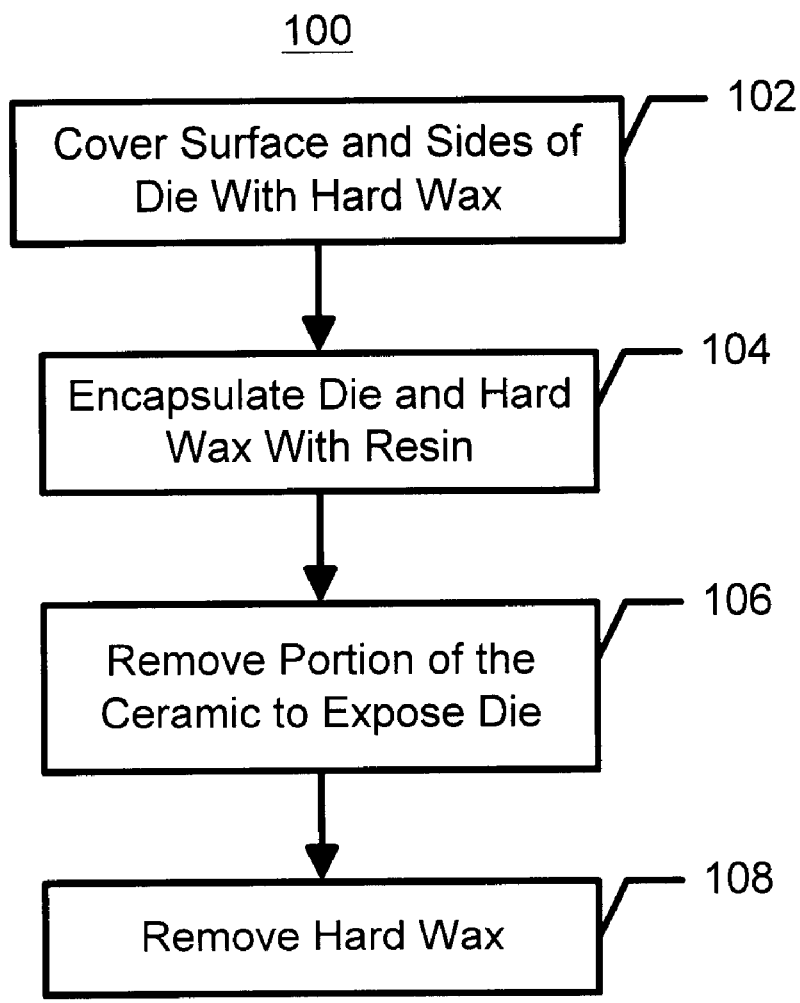
FIG. 4 is a high-level flow chart of a method in accordance with the present invention for removing a semiconductor die from a semiconductor package.

To more particularly illustrate the method and system in accordance with the present invention, refer now to FIGS. 4 and 5A through 5F. FIG. 4 depicts one embodiment of a method 100 in accordance with the present invention for removing a die 12 from the semiconductor package 10. The method 100 preferably commences after the die 12 and a portion of the ceramic base 14 have been cut from the remainder of the semiconductor package 10. Thus, the ceramic base 14 is of a more manageable size. In a preferred embodiment, the method 100 also commences after the die 12 has been thinned to less than or equal to approximately one hundred microns and preferably to between fifty and eighty microns, and has been glued to a second die (not shown). FIGS. 5A through 5F depict the die 12 and ceramic base 14 during separation of the die 12 from the ceramic base 14.

Figure 5A:
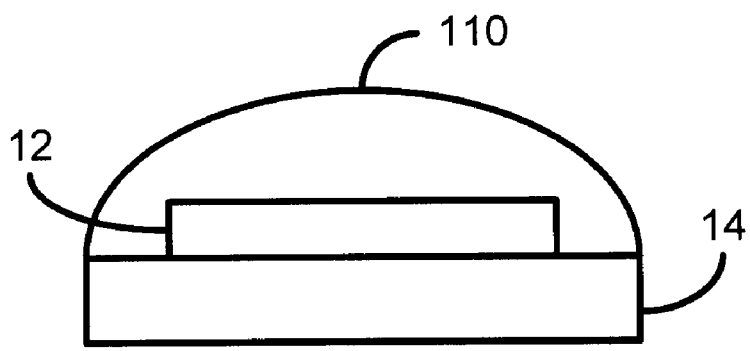
FIGS. 5A through 5F depict the semiconductor die during removal from the semiconductor package.

Referring to FIGS. 4 and 5A through 5F, the die 12 is covered with a hard wax 110, via step 102. Preferably, the hard wax is solid and not very pliable around room temperature. The hard wax preferably has a melting point of approximately two hundred degrees centigrade. Thus, the hard wax 110 melts readily at a particular temperature, but is relatively solid below that temperature. When the hard wax 110 has melted, the hard wax 110 is preferably applied to the die 12 and ceramic base 14 drop by drop. As a result, the hard wax 110 can cover the die 12 without greatly raising the temperature of the die 12. FIG. 5A depicts the die 12 and ceramic base 14 after the die 12 has been covered by the hard wax 110.

Figure 5B:
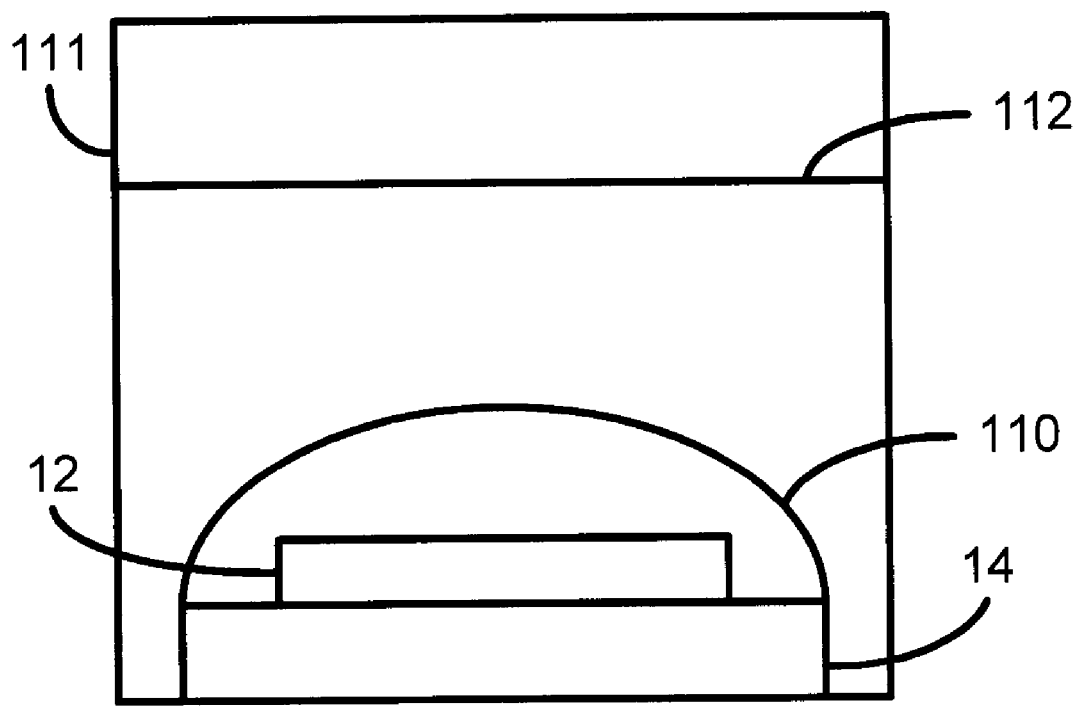
Figure 5C:
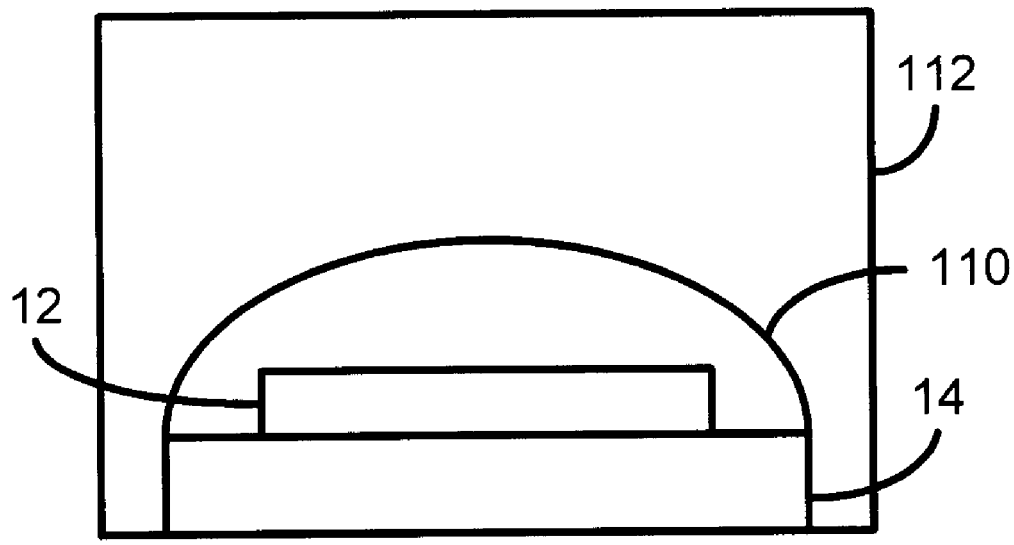

The combination of the hard wax 110, die 12 and ceramic base 14 are encapsulated in a resin 112, via step 104. Preferably, step 104 is performed by placing the combination of the hard wax 110, die 12 and ceramic base 14 with the ceramic base 14 down in a plastic cup 111 or other mold. The cup 111 is then filled with sufficient resin to cover the hard wax. FIG. 5B depicts the die 12 after the cup 111 has been filled with resin 112. Step 104 also includes allowing the resin to cure. In a preferred embodiment, the resin 112 cures overnight at room temperature. Step 104 also preferably includes removing the resin 112, hard wax 110, die 12 and ceramic base 14 from the cup 111. FIG. 5C depicts the resin 112, hard wax 110, die 12 and ceramic base 14 after removal from the cup 111.

Figure 5D:
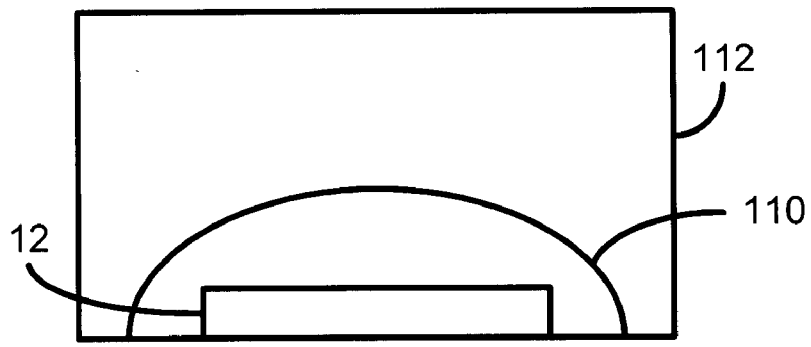
Figure 5E:
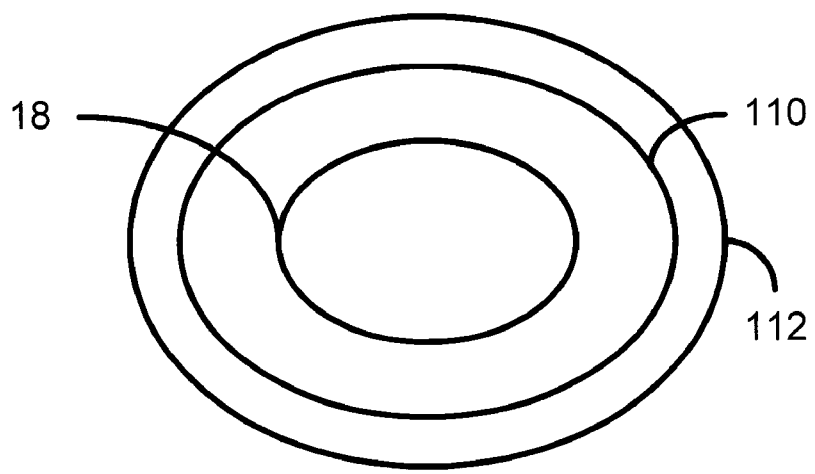
Figure 5F:
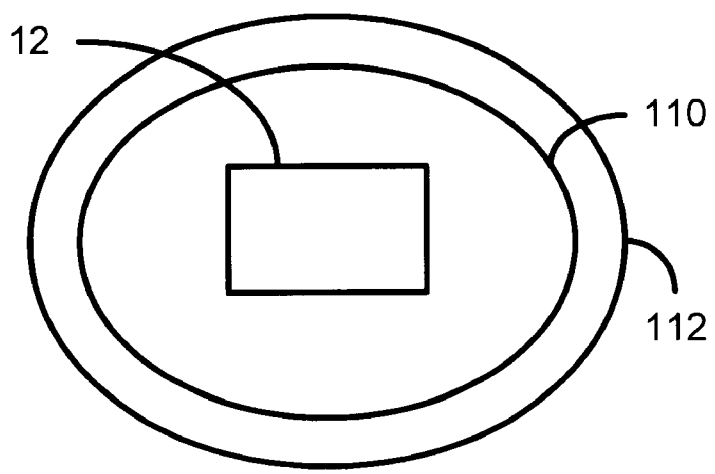

A portion of the ceramic base 14 is then removed in order to expose the die 12, via step 106. Preferably, step 106 includes mechanically grinding the ceramic base 14 and some portion of the resin 112 until either the die 12 is visible or the underfill 18 is visible. Also in a preferred embodiment, some or all of the underfill 18 and solder bumps 16 are removed. Furthermore, a rough grind is preferably used to remove a large portion of the ceramic base 14, followed by a finer grind when the desired portion of the ceramic base 14 is almost gone. In one embodiment, the finer grind uses a grit of approximately one hundred to two hundred. Also in a preferred embodiment, the removal of the ceramic base takes approximately one-half hour. In one embodiment, the underfill 18 has a distinctive color, such as blue. Thus, it is relatively easy to determine when the underfill 18 is visible and grinding should be halted. FIG. 5D depicts a side view of the die 12, resin 112 and hard wax 110 after the die 12 is visible. FIG. 5E depicts a bottom view of the hard wax 110, resin 112 and underfill 18 when, in one embodiment, grinding should cease. FIG. 5F depicts a bottom view of the hard wax 110, resin 112 and die 12 when, in one embodiment, grinding should cease. Note that the hard wax 110 may or may not be visible when grinding should be halted. Furthermore, note that all of the ceramic base 14 may not have been removed. Some portion of the ceramic base 14 may remain adhered to the hard wax 110 or resin 112, as long as the die 12 is free from the ceramic base 14.

Once grinding has been halted, the hard wax 110 is removed, via step 108. The hard wax 110 is preferably removed by immersing the hard wax 110 in a solvent that significantly softens and preferably dissolves the hard wax 110. In a preferred embodiment, the solvent is acetone. The solvent removes the wax without heating or damage to the die 12. When a sufficient amount of the hard wax 110 is removed, the die 12 is free. Additional cleaning and etching of the die may then be performed in order to deprocess the die 12.

Because the die 12 and ceramic base 14 are surrounded by the hard wax 110 and resin 112, the ceramic base 14 and the die 12 do not move significantly during grinding of the ceramic base 14. Thus, the die 12 is significantly less subject to breakage. Furthermore, use of the hard wax 110 allows the die 12 to be easily freed from the ceramic base 14 and the resin 112. Thus, resin 112 does not interfere with deprocessing of the die 12. Moreover, the method 100 is relatively simple and fast to perform. Consequently, the die 12 can be deprocessed and failure mechanisms for the die 12 determined.

Figure 6:
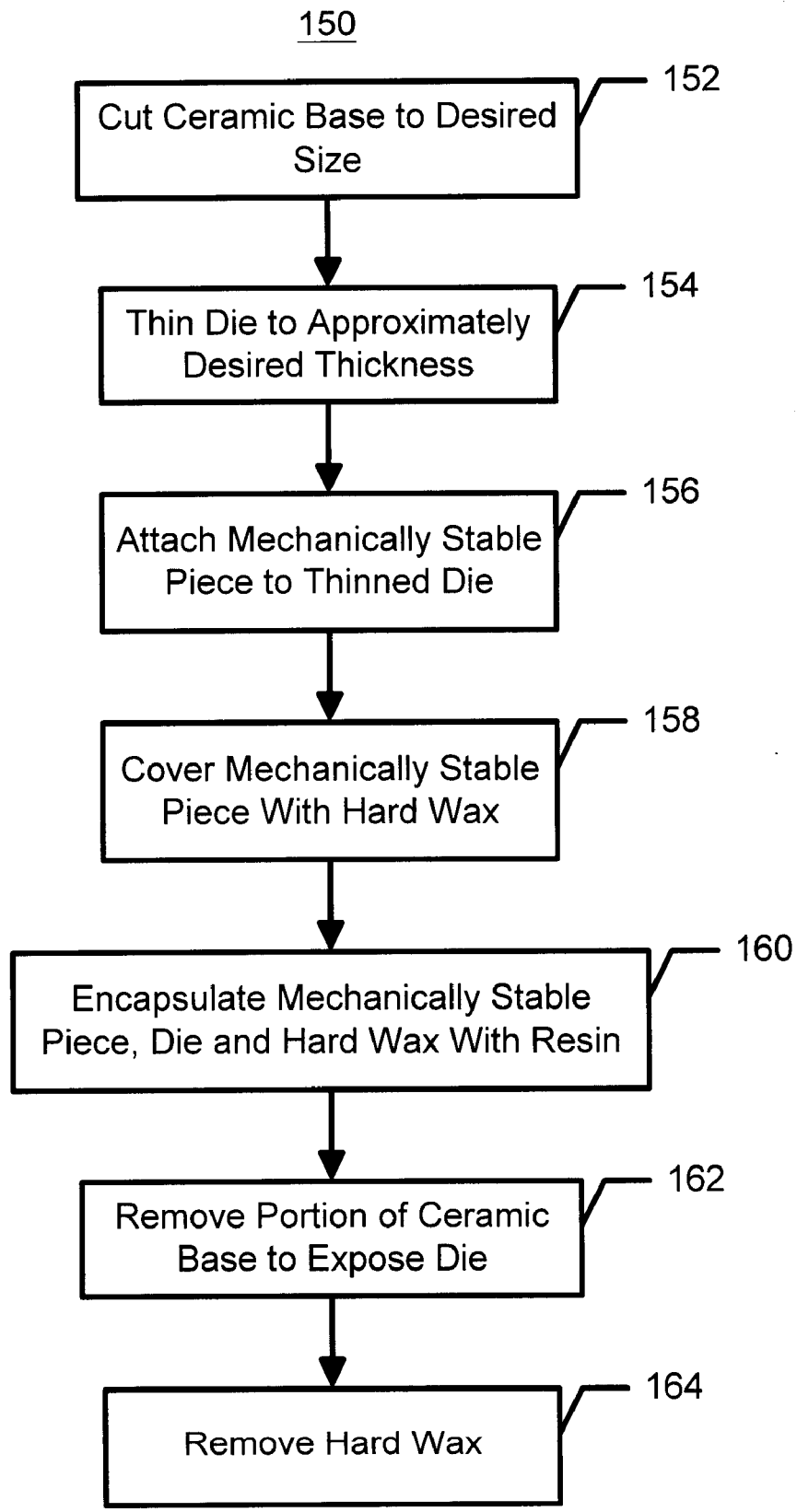
FIG. 6 is a more detailed flow chart of a method in accordance with the present invention for removing a semiconductor die from a semiconductor package.
Figure 7A:
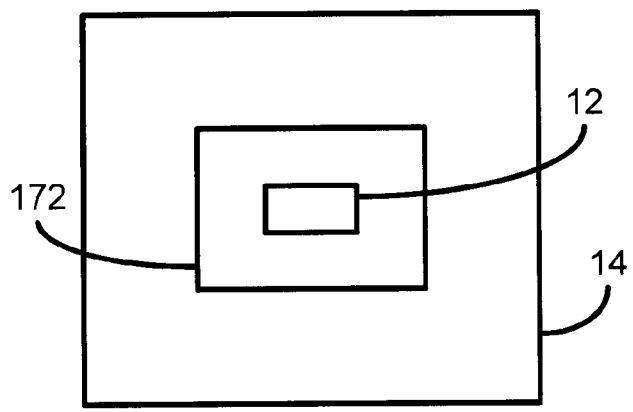
FIGS. 7A through 7H depict the semiconductor die during removal from the semiconductor package.

FIG. 6 depicts a more detailed flow chart of a preferred embodiment of a method 150 for removing the die 12 from a semiconductor package 14. In particular, the method 150 allows the die 12 to be thinned. FIGS. 7A through 7H depict the die 12 during various steps of the method 150. Referring to FIGS. 6 and 7A through 7H, a portion of the ceramic base 14 which contains the die 12 is cut from the semiconductor package 10. FIG. 7A depicts the die 12, the ceramic base 14, and the line 172 at which the ceramic base 14 is cut. Thus, a sample which is relatively easy to handle is obtained.

Figure 7B:
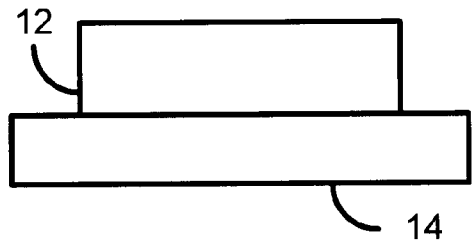
Figure 7C:
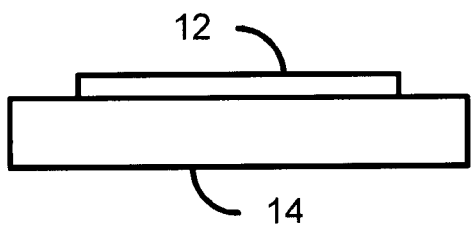

The die 12 is thinned, via step 154. The die 12 may be thinned to less than or equal to approximately one hundred microns and is preferably thinned to between fifty and eighty microns. FIGS. 7B and 7C depict the die 12 and ceramic base 14 before and after the die has been thinned. Note that the die 12 is typically on the order of several hundred microns thick before thinning. Consequently, FIGS. 7B and 7C, like the remaining diagrams, are not drawn to scale.

Figure 7D:
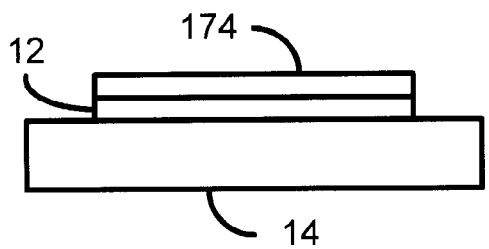

The die 12 is then attached to another more mechanically strong piece, via step 156. Preferably, a second die 174 is used. The second die is typically between seven hundred and eight hundred microns thick. In a preferred embodiment, the die 12 is glued to the second die 174. Also in a preferred embodiment, a relatively high-temperature, acid insensitive glue is used. The glue used is also preferably relatively inexpensive. In a preferred embodiment, the glue can be heated to a temperature of at least approximately three hundred and twenty-five degrees centigrade without being affected. Also in a preferred embodiment, the glue is insensitive to several acids at various temperatures. The glue is preferably insensitive to nitric acid at temperatures of at least sixty to seventy degrees centigrade. The glue is also preferably insensitive to hydrofluoric acid and insensitive to a mixture of acetic acid and $H_2O_2$ at room temperature. For example, JB WELD glue, which is commercially available, may be used and meets the preferred criteria. FIG. 7D depicts the die 12 as attached to the second die 174 and the ceramic base 14.

Figure 7E:
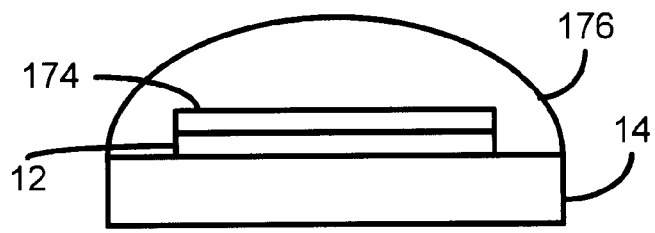

The die 12 is then covered with hard wax 176, via step 158. Preferably, this is accomplished by covering the exposed surface of second die 174, the sides of the die 12, the sides of the second die 174 and the exposed surface of the ceramic base 14 with the hard wax 176. In a preferred embodiment, the hard wax 176 used shares the same properties as the hard wax 110 used in the method 100 depicted in FIG. 4. Thus, the hard wax 176 preferably melts readily at a relatively high temperature, such as two hundred degrees centigrade, but is solid at room temperature. Referring back to FIGS. 6 and 7A–7H, the hard wax 176 is preferably melted and applied to the die 12, the second die 174 and the ceramic base 14 drop by drop. As a result, the temperature of the die 12 is not greatly changed during application of the hard wax 176. FIG. 7E depicts the die 12 after it has been covered with the hard wax in step 158.

Figure 7F:
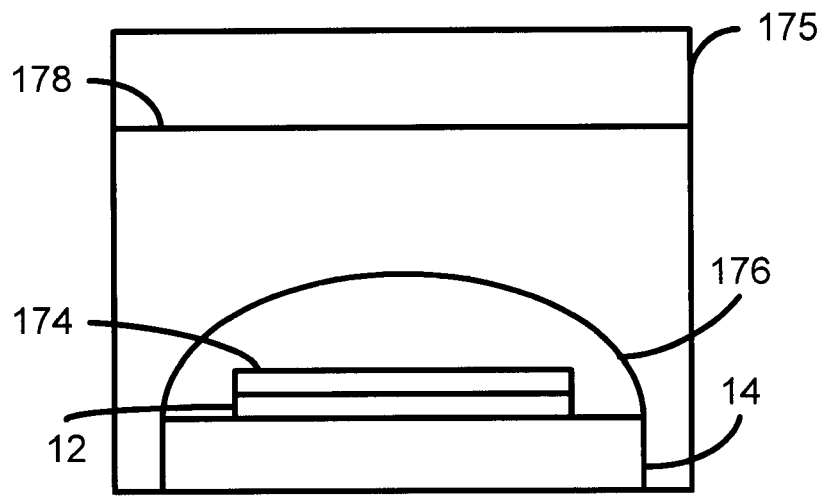
Figure 7G:
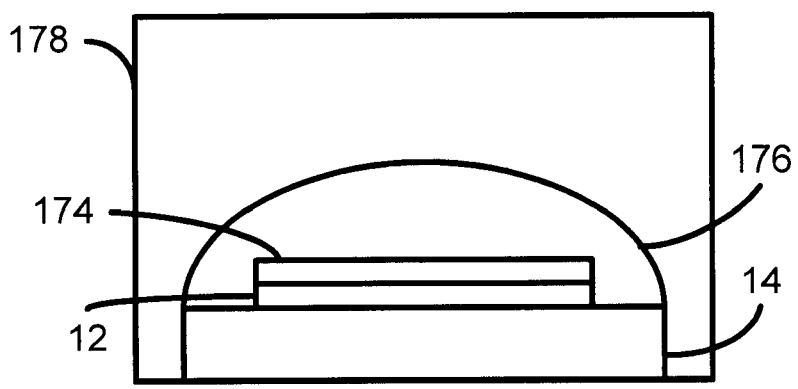

The hard wax 176, ceramic base 14, die 12 and second die 174 are encapsulated in a resin 178. Preferably, the hard wax 176, ceramic base 14, die 12 and second die 174 are placed in a mold or cup 175 with the ceramic base 14 resting on the bottom. The cup 175 is then filled with sufficient resin 178 to cover the hard wax 176. FIG. 7F shows the cup 175 filled with resin 178. The resin 178 is allowed to cure and then removed from the cup 175 or mold. FIG. 7 shows the hard wax 176, ceramic base 14, die 12, second die 174 and the resin 178 after removal from the cup 175 or mold.

Figure 7H:
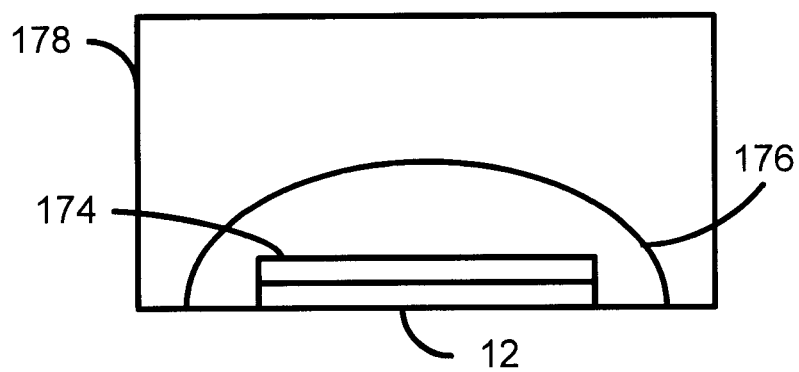

A portion of the ceramic base 14 is then removed in order to expose the die 12, via step 162. Preferably, step 162 is performed by mechanically grinding the ceramic base 14 and any portion of the resin 178 that are required. Also in a preferred embodiment, some or all of the underfill 18 and solder bumps 16 are removed. Furthermore, a rough grind is preferably used to remove a large portion of the ceramic base 14, followed by a finer grind when the desired portion of the ceramic base 14 is almost gone. In one embodiment, the finer grind uses a grit of approximately one hundred to two hundred. Also in a preferred embodiment, the removal of the ceramic base takes approximately one-half hour. Also in a preferred embodiment, grinding continues until the underfill 18 is visible. In one embodiment, the underfill 18 has a distinctive color, such as blue. Thus, it is relatively easy to determine when the underfill 18 is visible and grinding should be halted. In another embodiment, the grinding continues until the die 12 is visible. FIG. 7H depicts a side view of the die 12, hard wax 176 and resin 178 after the die has been exposed. Although none of the ceramic base 14 is depicted, all of the ceramic base 14 may not have been removed. Some portion of the ceramic base 14 may remain adhered to the hard wax 176 or resin 178, as long as the die 12 is free from the ceramic base 14.

The die 12 and second die 174 are then removed from the hard wax 176, via step 164. Preferably, step 174 is accomplished by exposing the hard wax 176 to a solvent which significantly softens and preferably dissolves the hard wax 176. In a preferred embodiment, the solvent is acetone. The solvent removes the wax without heating or damage to the die 12. Thus, the combination of the die 12 and second die 174 is freed from the resin 178 and the ceramic base 12. Any additional cleaning required can then be relatively easily performed and the die 12 can be deprocessed.

Use of the second die 174 adds mechanical stability to the die 12, allowing the die 12 to be thinned and removed from the ceramic base 12 without undue concern about the fragility of the die 12. The second die 174 could be glued to the die 12 after the die has been separated from the ceramic base 14. However, note that in this case the die 12 is more subject to failure because the thinned die 12 is not as mechanically sound. Because the die 12, the second die 174 and the ceramic base 14 are surrounded by the hard wax 176 and resin 178, the ceramic base 14 and the die 12 do not move significantly during grinding of the ceramic base 14. Thus, the die 12 is significantly less subject to breakage. Furthermore, use of the hard wax 178 allows the die 12 and the second die 174 to be easily freed from the ceramic base 14 and the resin 178. Thus, resin 178 does not interfere with deprocessing of the die 12. Consequently, the die 12 can be deprocessed and failure mechanisms for the die 12 determined. Moreover, the method 150 is relatively simple and fast to perform.

A method and system has been disclosed for removing a die from a semiconductor package. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for removing a die from a semiconductor package, the semiconductor package including the die and a ceramic base, the die having a first face, a second face and a plurality of sides, the second face of the die coupled with the ceramic base, the method comprising the steps of:
   (a) covering at least the first face and a portion of the plurality of sides of the die with a hard wax;
   (b) encapsulating the hard wax and at least a first portion of the ceramic base in a resin;
   (c) removing at least a second portion of the ceramic base to expose the second face of the die; and
   (d) removing the hard wax to free the die.

2. The method of claim 1 wherein the hard wax removing step (d) further includes the step of:
   (d1) exposing the hard wax to a solvent.

3. The method of claim 2 wherein the solvent further includes acetone.

4. The method of claim 1 wherein the ceramic base removing step (c) further includes the step of:
   (c1) grinding the second portion of the ceramic base.

5. The method of claim 4 wherein the semiconductor package further includes a plurality of solder bumps and an underfill between the ceramic base and the die, and wherein the ceramic base grinding step (c1) further includes the step of:
   (c1i) grinding the second portion of the ceramic base until the underfill is visible.

6. The method of claim 1 wherein the die is less than one hundred microns thick.

7. The method of claim 6 wherein the die is less than eighty microns thick.

8. The method of claim 1 further comprising the step of:
   (e) thinning the die to be one hundred microns or less thick.

9. The method of claim 1 further comprising the step of:
   (e) gluing the first face of the die to a second die prior to covering the first face and the portion of the plurality of sides of the die with the hard wax.

10. The method of claim 9 wherein a high-temperature acid insensitive glue is used in gluing the first face of the die to the second die.

11. The method of claim 9 wherein the hard wax covering step (a) further includes the step of:
    (a1) covering the second die and the portion of the plurality of sides with the hard wax.

* * * * *